(12) United States Patent
Ueki et al.

(10) Patent No.: US 9,558,824 B2
(45) Date of Patent: Jan. 31, 2017

(54) SEMICONDUCTOR DEVICE AND OPERATING METHOD THEREOF

(71) Applicant: Renesas Electronics Corporation, Tokyo (JP)

(72) Inventors: Makoto Ueki, Tokyo (JP); Takashi Hase, Tokyo (JP); Yoshihiro Hayashi, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/992,724

(22) Filed: Jan. 11, 2016

(65) Prior Publication Data
US 2016/0284405 A1 Sep. 29, 2016

(30) Foreign Application Priority Data

Mar. 23, 2015 (JP) .................................. 2015-060108

(51) Int. Cl.
| | | |
|---|---|---|
| G11C 11/00 | (2006.01) | |
| G11C 13/00 | (2006.01) | |
| H01L 27/24 | (2006.01) | |
| H01L 45/00 | (2006.01) | |

(52) U.S. Cl.
CPC ....... G11C 13/0069 (2013.01); H01L 27/2436 (2013.01); H01L 27/2463 (2013.01); H01L 45/085 (2013.01); H01L 45/1233 (2013.01); H01L 45/146 (2013.01)

(58) Field of Classification Search
CPC ............. G11C 13/0069; H01L 27/2436; H01L 27/2663; H01L 45/085; H01L 45/1233; H01L 45/146

USPC ............... 365/148, 46, 55, 74, 97, 100, 131, 158,365/171, 173, 163
See application file for complete search history.

(56) References Cited

U.S. PATENT DOCUMENTS

| | | | |
|---|---|---|---|
| 7,719,052 B2 | 5/2010 | Ito et al. | |
| 2009/0014770 A1* | 1/2009 | Terao .................. | G11C 11/5614 257/314 |
| 2011/0140762 A1* | 6/2011 | Jiang ..................... | C23C 14/081 327/365 |
| 2012/0292584 A1* | 11/2012 | Rocklein ................. | H01L 45/08 257/2 |

(Continued)

FOREIGN PATENT DOCUMENTS

| | | |
|---|---|---|
| JP | 2006-100531 A | 4/2006 |
| JP | 2008-227267 A | 9/2008 |

*Primary Examiner* — Fernando Hidalgo
(74) *Attorney, Agent, or Firm* — McGinn IP Law Group, PLLC.

(57) ABSTRACT

To improve information retention resistance of a resistance change memory which requires high information retention resistance. On the assumption that a special data storage memory and a general-purpose data storage memory are distinguished from each other, a forming operation small in resistance rise rate is used for an information writing operation of the special data storage memory. A switching operation is used for information writing of the general-purpose data storage memory. That is, the special data storage memory is configured so as to store information while adapting an initial resistance state to "0" whereas adapting a low resistance state to "1". On the other hand, the general-purpose data storage memory is configured so as to store information while adapting a high resistance state to "0" whereas adapting a low resistance state to "1".

7 Claims, 12 Drawing Sheets

(56) References Cited

U.S. PATENT DOCUMENTS

2014/0219034 A1\* 8/2014 Gomez ................ G11C 16/06
                                                                             365/185.22
2016/0005792 A1\* 1/2016 Ueki ...................... H01L 45/08
                                                                             257/4

\* cited by examiner

FORMING OPERATION

OFF OPERATION

ON OPERATION

SEMICONDUCTOR DEVICE AND OPERATING METHOD THEREOF

CROSS-REFERENCE TO RELATED APPLICATIONS

The disclosure of Japanese Patent Application No. 2015-060108 filed on Mar. 23, 2015 including the specification, drawings and abstract is incorporated herein by reference in its entirety.

BACKGROUND

The present invention relates to a semiconductor device and an operating method thereof, and to a technology effective when applied to, for example, a semiconductor device including a resistance change memory (ReRAM: Resistive Random Access Memory) and an operating method thereof.

A technology related to a resistance change memory has been described in Japanese Unexamined Patent Publication Laid-Open No. 2008-227267 (Patent Document 1). In particular, a technology of reducing a voltage necessary for a forming operation of the resistance change memory has been described therein. Specifically, there has been described therein that the forming operation of the resistance change memory is performed in a heated state.

There has been described in Japanese Unexamined Patent Publication Laid-Open No. 2006-100531 (Patent Document 2) that a first MONOS type nonvolatile storage element and a second MONOS type nonvolatile storage element larger in gate width than the first MONOS type nonvolatile storage element are mounted over the same substrate in a mixed manner. At this time, there has been described in Patent Document 1 that the first MONOS type nonvolatile storage element is used for program data storage small in the number of times of rewriting, whereas the second MONOS type nonvolatile storage element is used for processing data storage large in the number of times of rewriting.

RELATED ART DOCUMENTS

Patent Documents

[Patent Document 1] Japanese Unexamined Patent Publication Laid-Open No. 2008-227267
[Patent Document 2] Japanese Unexamined Patent Publication Laid-Open No. 2006-100531

SUMMARY

Since a resistance change memory which is a novel nonvolatile memory can be operated at a low voltage as compared with a flash memory which has heretofore been used, the resistance change memory has been expected to be used in, for example, a microcomputer (MCU) driven with low power. A semiconductor device including such a resistance change memory may execute writing of a boot program and test selection information before an assembly step or a mounting step. In this case, however, since the assembly step including a heating step, and the mounting step are conducted after the writing of information into the resistance change memory, there is a possibility that the information stored in the resistance change memory may be damaged depending on the conditions. Accordingly, the resistance change memory which stores the information written before the assembly step including the heating step or before the mounting step is required to have such high information retention resistance (retention resistance) that the disappearance of the information does not occur even if a large thermal history is added, as compared with a resistance change memory which stores information written after the completion of a product.

Other objects and novel features of the present invention will become apparent from the description of the present specification and the accompanying drawings.

A semiconductor device according to one aspect of the present invention is equipped with a first resistance change memory which stores information therein, based on an initial resistance state and a low resistance state both distinguished from each other, and a second resistance change memory which stores information therein, based on a high resistance state and a low resistance state both distinguished from each other. Here, a resistance value in the initial resistance state is higher than a resistance value in the high resistance state. A resistance value in the high resistance state is higher than a resistance value in the low resistance state.

Also, in a method of operating a semiconductor device according to another aspect of the present invention, while a first memory cell of a first resistance change memory and a second memory cell of a second resistance change memory are the same in structure, a writing operation of the first memory cell and a writing operation of the second memory cell are different from each other.

Further, a semiconductor device according to a further aspect of the present invention is equipped with a first resistance change memory and a second resistance change memory. At this time, a first memory cell of the first resistance change memory includes a first semiconductor element which selects the first memory cell. The first semiconductor element is comprised of a high current driving element capable of being driven up to a first allowance current. On the other hand, a second memory cell of the second resistance change memory includes a second semiconductor element which selects the second memory cell. The second semiconductor element is comprised of a low current driving element capable of being driven up to a second allowable current lower than the first allowable current.

According to one aspect of the present invention, in a semiconductor device including a plurality of resistance change memories, the resistance change memory of the resistance change memories, which is required to have high information retention resistance, can be improved in information retention resistance.

DETAILED DESCRIPTION

Figure 1:
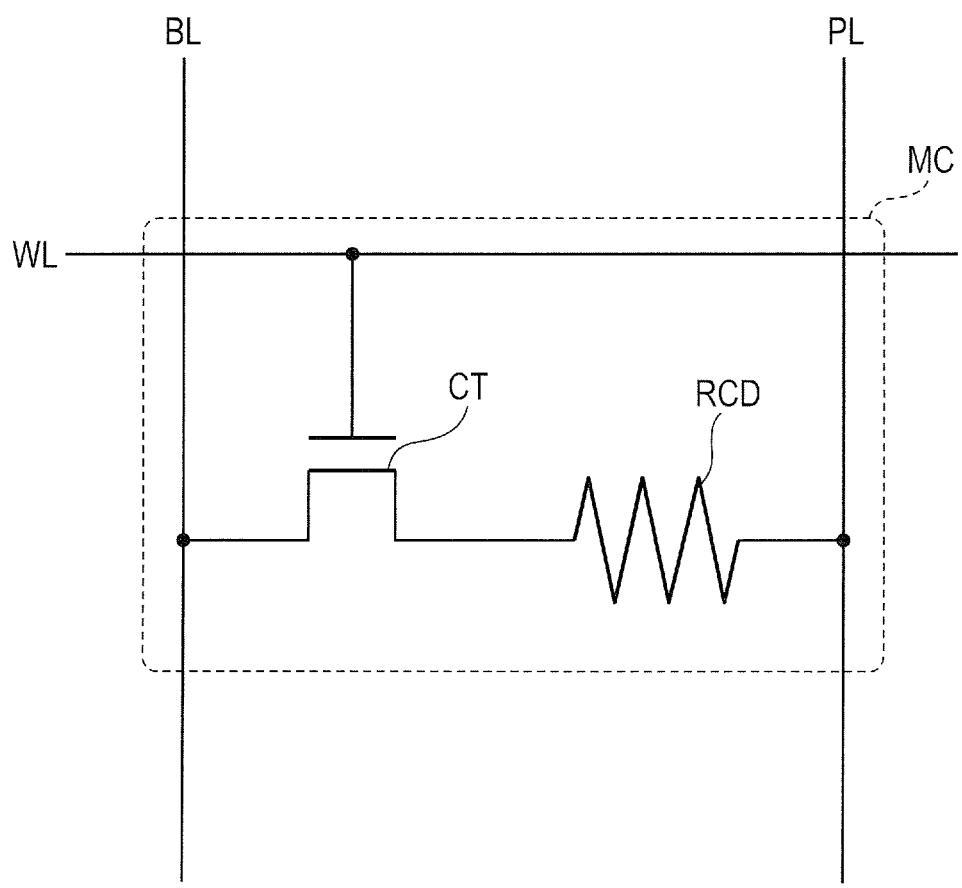
FIG. 1 is a circuit diagram showing a circuit configuration of a memory cell which configures a resistance change memory.

The invention will be described by being divided into a plurality of sections or embodiments whenever circumstances require it for convenience in the following embodiments. However, unless otherwise specified in particular, they are not irrelevant to one another. One thereof has to do with modifications, details, supplementary explanations, etc. of some or all of the other.

Also, when reference is made to the number of elements or the like (including the number of pieces, numerical values, quantity, range, etc.) in the following embodiments, the number thereof is not limited to a specific number and may be greater than or less than or equal to the specific number except for where otherwise specified in particular and definitely limited to the specific number in principle, etc.

It is further needless to say that in the following embodiments, components (also including element steps, etc.) employed therein are not always essential except for where otherwise specified in particular and considered to be definitely essential in principle, etc.

Similarly, when reference is made to the shapes, positional relations and the like of the components or the like in the following embodiments, they will include ones substantially analogous or similar to their shapes or the like except for where otherwise specified in particular and considered not to be definitely so in principle, etc. This is similarly applied even to the above-described numerical values and range.

The same reference numerals are respectively attached to the same members in principle in all the drawings for describing the embodiments, and a repeated description thereof will be omitted. Incidentally, even plan diagrams may be hatched to make the drawings easier to understand.

Embodiment 1

Configuration of Memory Cell

FIG. 1 is a circuit diagram showing a circuit configuration of a memory cell MC which configures a resistance change memory. In FIG. 1, the memory cell MC has a cell transistor CT which has a function as a selection part for selecting the memory cell MC, and a resistance change device RCD which functions as a storage part for storing information therein. The cell transistor CT and the resistance change device RCD are coupled in series. Then, a gate electrode of the cell transistor CT is electrically coupled to a word line WL. Further, the cell transistor CT and a bit line BL are electrically coupled to each other, and the resistance change device RCD and a plate line PL are electrically coupled to each other.

Operation of Memory Cell

The operation of the memory cell will next be described. In the resistance change memory, information is stored based on the resistance state of the resistance change device RCD. Specifically, a high resistance state and a low resistance state exist in the resistance change device RCD. For example, the high resistance state is adapted to "0", and the low resistance state is adapted to "1" to thereby make it possible to store information in the resistance change device RCD. Thus, an operation for realizing each of the high resistance stat and the low resistance state is required to store the information into the resistance change device RCD.

Figure 2:
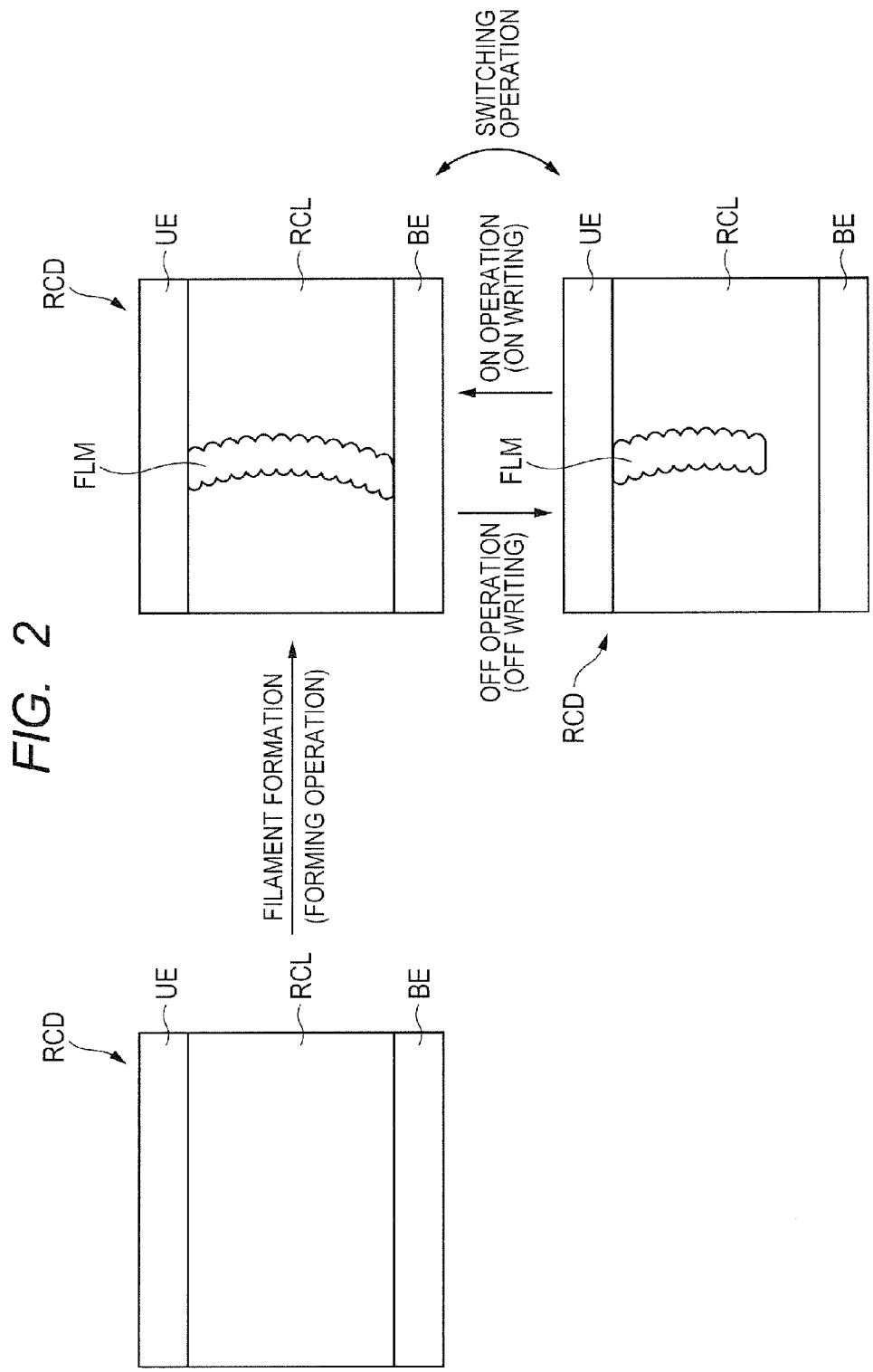
FIG. 2 is a diagram for describing a mechanism of realizing a high resistance state and a low resistance state in a resistance change device.

FIG. 2 is a diagram for describing a mechanism of realizing the high resistance state and the low resistance state in the resistance change device RCD. In FIG. 2, the resistance change device RCD has an upper electrode UE, a lower electrode BE, and a resistance change layer RCL. The resistance change device RCD has a structure in which the resistance change layer RCL is sandwiched by the upper electrode UE and the lower electrode BE. At this time, the initial state of the resistance change device RCD is placed in an initial resistance state being an insulated state, which is neither the high resistance state nor the low resistance state. A resistance value of the resistance change device RCD in the initial resistance state is extremely high and placed in a state of higher than in the high resistance state. It is therefore necessary for the resistance change device RCD to reduce its resistance value from the initial resistance state. In order to realize this operation, a forming operation which is an initialization operation is carried out.

Specifically, in FIG. 2, a high voltage is applied between the upper electrode UE and the lower electrode BE to thereby form in the resistance change layer RCL comprised of a metal oxide film, a conductive path FLM called a filament, which is comprised of a chain of oxygen deficiency. Thus, in the resistance change layer RCL, current can be made to flow through the conductive path FLM so that the low resistance state is realized. That is, the resistance change device RCD changes from the initial resistance state to the low resistance state by carrying out the forming operation. Thus, the initial resistance state of the resistance change device RCD is defined as a state in which the conductive path FLM is not formed in the resistance change layer RCL, whereas the low resistance state of the resistance change device RCD is defined as a state in which the conductive path FLM for coupling the upper electrode UE and the lower electrode BE is formed in the resistance change layer RCL. It can thus be said that the forming operation is an operation for forming the conductive path FLM in the resistance change layer RCL.

Thereafter, a voltage which is opposite in polarity to the forming operation is applied between the upper electrode UE and the lower electrode BE. In this case, in the metal oxide film which configures the resistance change layer RCL as shown in FIG. 2, part of the conductive path FLM comprised of the chain of the oxygen deficiency is filled with oxygen. This means that part of the conductive path FLM comprised of the chain of the oxygen deficiency disappears. Consequently, the resistance value of the resistance change layer RCL rises. This state is the high resistance value of the resistance change device RCD. That is, the high resistance state of the resistance change device RCD can be defined as the state in which part of the conductive path FLM disappears, while the conducive path FLM is formed in the resistance change layer RCL. In the present specification, the operation of transitioning the resistance change device RCD from the low resistance state to the high resistance state will be called an "off operation (off writing)".

Subsequently, a voltage forward in polarity with the forming operation is applied between the upper electrode UE and the lower electrode BE. In this case, as shown in FIG. 2, oxygen deficiency is formed again in the disappearing part of the conductive path FLM in the metal oxide film which configures the resistance change layer RCL. As a result, a conductive path FLM comprised of a chain of oxygen deficiency is formed again between the upper electrode UE and the lower electrode BE, so that the resistance value of the resistance change layer RCL is reduced. Thus, the low resistance state of the resistance change device RCD is realized again. In the present specification, the operation of transitioning the resistance change device RCD from the high resistance state to the low resistance state in this way will be called an "on operation (on writing)". It is understood that information can be written into the resistance change device RCD by repeating the on operation and the off operation after the execution of the forming operation in the above-described manner. That is, it is understood that information can be rewritten into the resistance change device RCD at any number of times by repeating the off operation and the on operation. Here, in the present specification, the off operation and the on operation are combined together, which will be referred to as a "switching operation". Thus, it is possible to write the information into the resistance change device RCD by carrying out this switching operation.

Examination of Improvement

Figure 3:
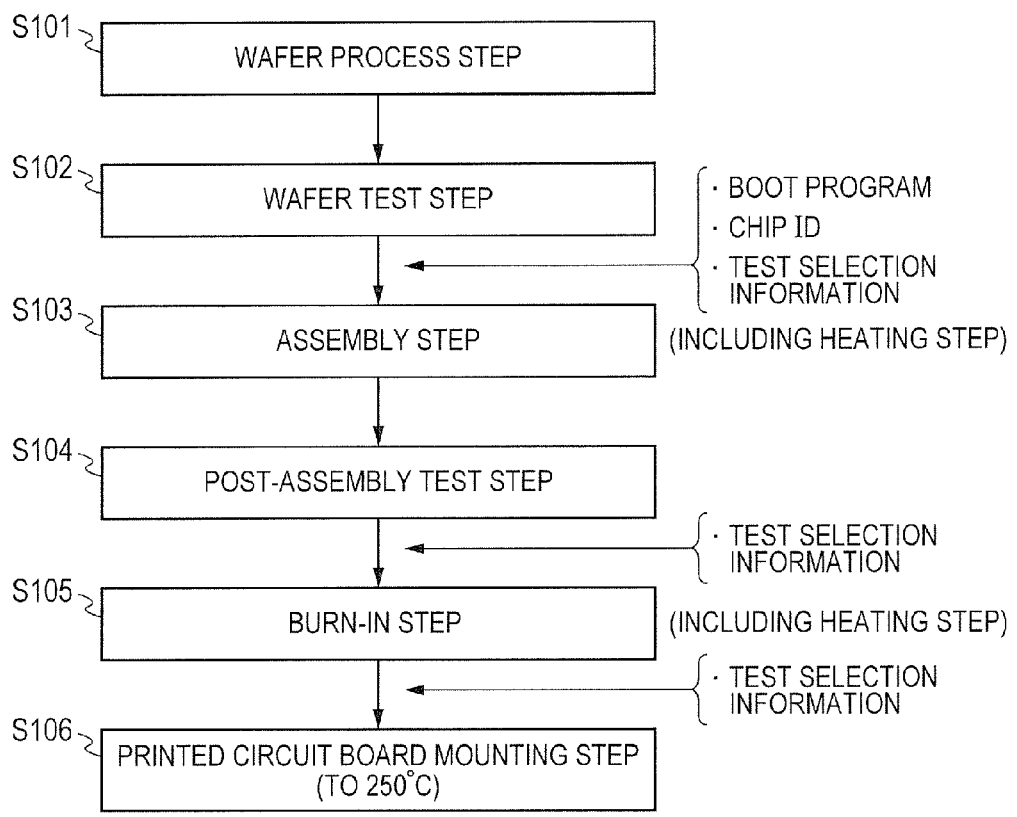
FIG. 3 is a flowchart showing the flow of a manufacturing process of a semiconductor device including the resistance change memory.

An improvement in the resistance change memory will next be examined. FIG. 3 is a flowchart showing the flow of a manufacturing process of a semiconductor device including the resistance change memory. In FIG. 3, a device structure including the resistance change memory is formed in a semiconductor wafer by a wafer process step (S101). Then, the flow proceeds to a wafer test step, where an electrical characteristic inspection and an external appearance inspection on the device structure formed in the semiconductor wafer are carried out (S102). After the execution of this wafer test step, for example, a boot program, a chip ID, and test selection information are written into the resistance change memory formed in the semiconductor wafer.

Subsequently, the semiconductor wafer is divided into a plurality of individual semiconductor chips by using a dicing technique, and thereafter an assembly step is performed on the semiconductor chip (S103). Specifically, the assembly step includes, for example, a die bonding step for mounting the semiconductor chip over a chip mounting part, a wire bonding step for coupling the semiconductor chip and external terminals by wires, a sealing step for sealing the semiconductor chip with a resin, etc.

Thereafter, the flow proceeds to a post-assembly test step, where an electrical characteristic inspection and an external appearance inspection are performed on the semiconductor device manufactured through the assembly step (S104). After the execution of the post-assembly test step, for example, the test selection information is written into the resistance change memory formed in the semiconductor device.

Next, in order to eliminate an initial failure, the flow proceeds to a burn-in step where a burn-in test (acceleration test) is conducted on the semiconductor device (S105). After the conduction of the burn-in step, for example, test selection information is written into the resistance change memory formed in the semiconductor device.

The semiconductor device including the resistance change memory can be manufactured in the above-described manner. Then, the manufactured semiconductor device is shipped. At its shipment destination, the semiconductor device is mounted over a printed circuit board (mounting board) by using a solder material, for example (S106). Since it is necessary to melt the solder material in this printed circuit board mounting step, for example, a heating step at 250° C. or so is included therein. Thereafter, the writing of information is performed on the completed product by using the resistance change memory included in the semiconductor device. That is, the writing of the information in the resistance change memory is performed according to the normal use application of the completed product.

Here, as described above, the special data such as the boot program, chip ID, test selection information or the like is written into the resistance change memory in the manufacturing process of the semiconductor device. Then, the heating step included in each of the assembly step, the burn-in step and the printed circuit board mounting step and so on is conducted on the resistance change memory with the special data written therein. In this case, there is concern that information holding resistance (retention resistance) of the resistance change memory will be deteriorated by the heating step. That is, since it is considered that the information holding resistance (retention resistance) of the resistance change memory will be deteriorated at a high temperature, there is a possibility that the special data written into the resistance change memory during the manufacturing process may disappear due to the subsequent heating step.

Therefore, in order to suppress the disappearance of the special data written into the resistance change memory during the manufacturing process due to the subsequent heating step, the present embodiment 1 is devised for improving the information holding resistance of the resistance change memory. A description will be made below about the technical idea in the devised embodiment 1.

Novel Finding Found by the Present Inventors

Figure 4:
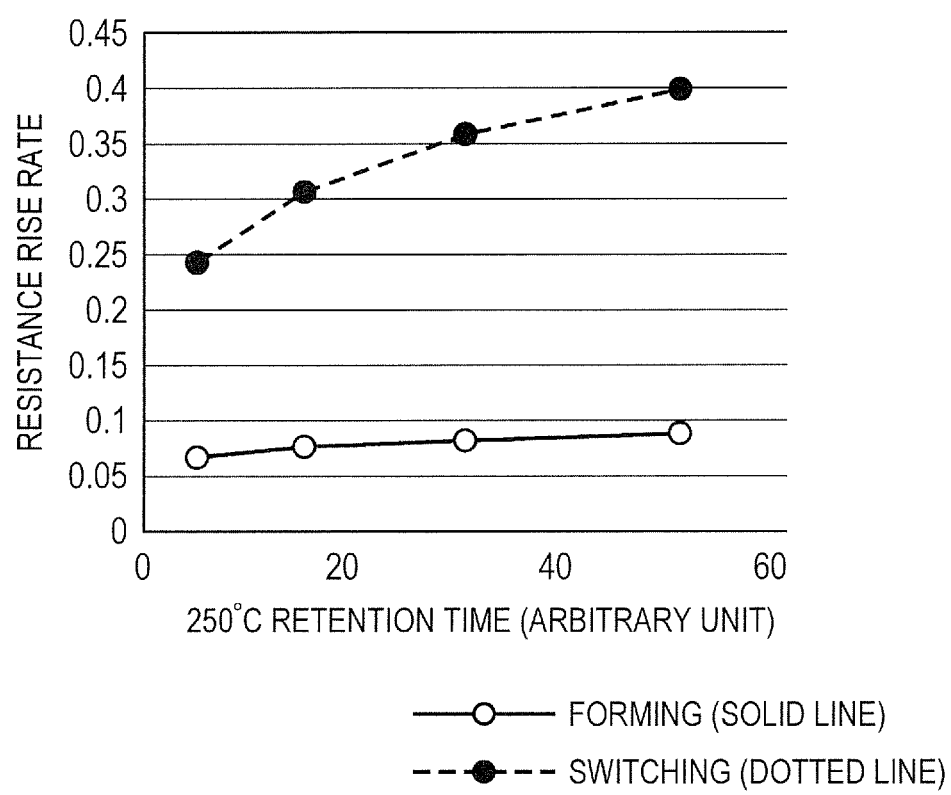
FIG. 4 is a graph showing the relationship between time during which the resistance change device is maintained at a temperature of 250° C. and a resistance rise rate thereof in the low resistance state of the resistance change device.

FIG. 4 is a graph showing the relationship between time during which the resistance change device is maintained at the temperature of 250° C. and its resistance rise rate in the low resistance state of the resistance change device. In FIG. 4, the horizontal axis indicates the time during which the resistance change device is maintained at the temperature of 250° C., and the vertical axis indicates the resistance rise rate. Further, a solid line indicates a low resistance state after the forming operation, and a dotted line indicates a low resistance state after the switching operation. It is understood that as shown in FIG. 4, the resistance rise rate in the low resistance state after the forming operation is very smaller than that in the low resistance state after the switching operation. In other words, it is understood that the resistance rise rate in the low resistance state after the switching operation is considerably larger than that in the low resistance state after the forming operation. That is, when the low resistance state of the resistance change device after the switching operation is maintained in a high temperature state for a long time, a rise in the resistance value becomes large. This means that the resistance value in the low resistance state approaches the resistance value in the high resistance state. It means that a retention failure that "1" is reversed to "0" becomes easy to occur. This means that the low resistance state after the switching operation shows the deterioration of the information holding resistance at the high temperature.

On the other hand, even when the low resistance state of the resistance change device after the forming operation is maintained in the high temperature state for a long time, the rise in the resistance value hardly occurs. This means that the resistance value in the low resistance state is hard to come close to the resistance value in the high resistance state and that the retention failure that "1" is reversed to "0" is hard to occur. This means that the low resistance state after the forming operation makes it possible to improve the information holding resistance at the high temperature as compared with the low resistance state at the switching operation. As described above, the novel finding found by the present inventors is that the resistance rise rate at the high temperature in the low resistance state after the forming operation is smaller than in the low resistance state after the switching operation, so that the information holding resistance becomes high.

This point will be described below since the present inventors have considered the mechanism of the above finding. For example, the low resistance state after the switching operation is that as shown in the operation mechanism of FIG. 2, the resistance change device is first changed from the initial resistance state to the low resistance state by the forming operation, and thereafter the resistance change device is changed from the low resistance state to the high resistance state by the off operation. After that, the resistance change device is changed from the high resistance state to the low resistance state again by the on operation. This state is the low resistance state after the switching operation. The high resistance state exists in the process of leading to the low resistance state after the switching operation. This high resistance state is a state in which part of the conductive path comprised of the chain of the oxygen deficiency is filled with oxygen and part of the conductive path is lost. The resistance value has been considered to be made unstable by accumulation of oxygen contributing to the off operation in an electrode interface even in the state in which the resistance change device is changed to the low resistance state in which the conductive path is formed. That is, the low resistance state after the switching operation is that the interposition of the high resistance state in the process causes the resistance rise rate in the low resistance state at the high temperature to rise, so that the information holding resistance is considered to be deteriorated.

On the other hand, the low resistance state after the forming operation is a state in which as shown in the operation mechanism of FIG. 2, the resistance change device is changed from the initial resistance state to the low resistance state by the forming operation. The low resistance state after the forming operation is different from the low resistance state after the switching operation, and no high resistance state exists. This means that the oxygen which contributes to the off operation is not accumulated in the electrode interface. It is thus considered that the oxygen has little affect on the conducive path comprised of the chain of the oxygen deficiency in the low resistance state after the forming operation. As a result, in the low resistance state after the forming operation, the information retention resistance at the high temperature is considered to be improved as a result of suppression of the rise in the resistance value. That is, the low resistance state after the forming operation is that in its process, the information retention resistance is considered to be improved due to the absence of the high resistance state.

The above is the finding newly acquired by the present inventors. Thus, since the present inventors envisions the basic idea in the present embodiment 1 shown below, based on the novel finding, the basic idea will be described below.

Basic Idea in the Embodiment 1

The basic idea in the present embodiment 1 resides in that in the manufacturing process of the semiconductor device, a resistance change memory in which special data such as a boot program, a chip ID, test selection information or the like is written, and a resistance change memory in which general-purpose data used for user's normal applications is written after the completion of a product are distinguished from each other. That is, assuming that the resistance change memory with the special data written therein will be called a special data storage memory, and the resistance change memory with the general-purpose data written therein will be called a general-purpose data storage memory, the basic idea in the present embodiment 1 resides in that the resistance change memories of the same structure are divided into the special data storage memory and the general-purpose data storage memory. That is, in the present embodiment 1, the resistance change memories having the same memory cell structure are distinguished into the special data storage memory and the general-purpose data storage memory. In this case, there is a point of difference in a thermal load to be applied between the special data storage memory and the general-purpose data storage memory. That is, in the special data storage memory, the special data is written therein in the manufacturing process of the semiconductor device and thereafter the heating step is added. Therefore, the special data storage memory is applied with a large thermal load and required to have high information retention resistance. On the other hand, since the general-purpose data is written into the general-purpose data storage memory when the product is used by a user after its completion, the general-purpose data storage memory needs not to consider the thermal load and is not required to have the high information retention resistance, like the special data storage memory.

Thus, the basic idea in the present embodiment 1 is that as the premise of making a distinction between the special data storage memory and the general-purpose data storage memory, the forming operation small in resistance rise rate is used for the information writing operation of the special data storage memory, and the switching operation is used for the information writing of the general-purpose data storage memory. In other words, the special data storage memory is configured to store information while adapting the initial resistance state to "0" whereas adapting the low resistance state to "1". The general-purpose data storage memory is configured to store information while adapting the high resistance state to "0" whereas adapting the low resistance state to "1". That is, the feature point of the basic idea in the present embodiment 1 resides in that the information is stored without the presence of the high resistance state while adapting "0" to the initial resistance state not used normally. Thus, the special data storage memory is capable of improving the information retention resistance because the high resistance state does not exist in the information writing process at the forming operation.

Here, in the special data storage memory, when the information is stored while the initial resistance state is adapted to "0" and the low resistance state is adapted to "1", the forming operation is performed only on a memory cell which stores "1" therein. In this case, the initial resistance state adapted to "0" is maintained in a memory cell which does not perform the forming operation. It is thus possible to store arbitrary information in the special data storage memory. In the special data storage memory, however, the memory cell brought into the low resistance state by carrying out the forming operation once cannot be changed to the initial resistance state adapted to "0" again. This is because it is not possible to cause the conductive paths formed once to disappear all. It is thus desirable that the special data storage memory is used as a singular-time write memory. In regard to this point, since the special data such as the boot program, chip ID, test selection information, etc. are normally processed in the form of singular-time writing, the special data storage memory can be used as the resistance change memory which stores these special data therein.

There is, however, a case where the special data such as the boot program, chip ID, test selection information or the like is also updated. Even in this case, the special data storage memory can be used. For example, at the first information writing, the information can be stored in the special data storage memory while the initial resistance state is adapted to "0" whereas the low resistance state is adapted to "1". In this case, since no high resistance state exists in the special data storage memory in the information writing process, the information retention resistance can be improved.

On the other hand, at the second information writing, the off operation of changing from the low resistance state to the high resistance state can be used as the operation of changing from "1" to "0". Further, the forming operation of changing from the initial resistance state to the low resistance state can be used as the operation of changing from "0" to "1". Even in this case, since the low resistance state changed via the high resistance state does not exist in the information writing operation of the special data storage memory, it is possible to achieve an improvement in information retention resistance. That is, while improving the information retention resistance, the special data storage memory capable of adapting even to the updating of the special data originally used in the singular-time writing can be provided. The feature point of the special data storage memory used herein resides in that the initial resistance state and the high resistance state in which the state adapted to "0" is held exist in a mixed form.

Further, at the third and subsequent information writing, the off operation of changing from the low resistance state to the high resistance state can be used as the operation of changing from "1" to "0". Further, the forming operation of changing from the initial resistance state to the low resistance state and the on operation of changing from the high resistance state to the low resistance state are used in a mixed form as the operation of changing from "0" to "1". In this case, since the low resistance state changed via the high resistance state exists in the information writing operation of the special data storage memory, it is difficult to achieve an improvement in the information retention resistance. There can however be provided the special data storage memory capable of adapting even to two or more renewals of the special data originally used in the singular-time writing while improving the information retention resistance at the singular-time writing and information writing only by one renewal.

Embodied Features of Basic Idea

As described above, the special data storage memory in the present embodiment 1 can be used not only as the singular-time write memory but also as the memory for writing of plural times which are more than twice. It is however desired that the special data storage memory is used as the singular-time write memory from the viewpoint of improving the information retention resistance. A description will therefore be made below about the information writing operation premising that the special data storage memory is used as the singular-time write memory.

Figure 5:
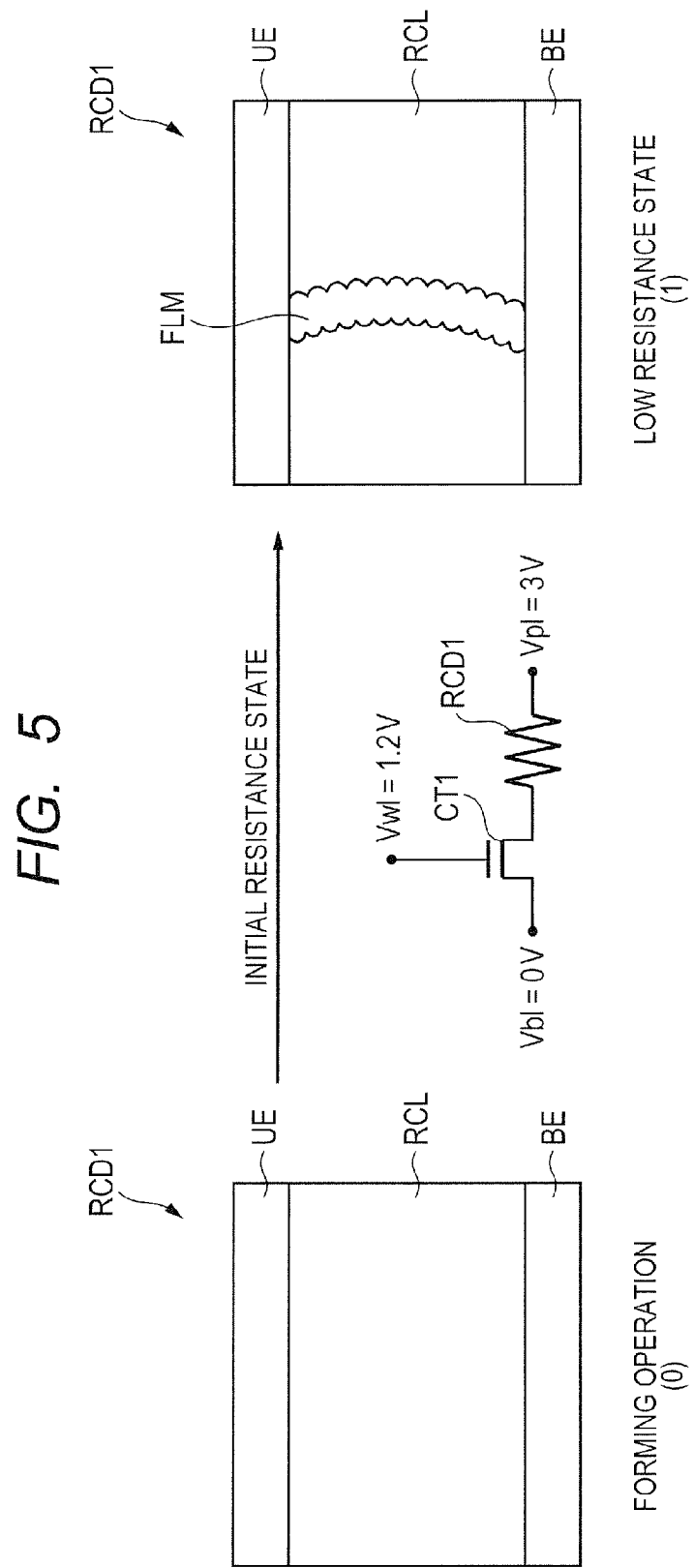
FIG. 5 is a typical diagram for describing the operation of writing information into a special data storage memory in an embodiment 1.

FIG. 5 is a typical diagram for describing the operation of writing information into the special data storage memory in the present embodiment 1. A typical configuration of a resistance change device RCD1 which configures a storage part of a memory cell in the special data storage memory in the present embodiment 1 is shown in FIG. 5. A state shown in the left diagram of FIG. 5 indicates an initial resistance state of the resistance change device RCD1. In this initial resistance state, no conductive path FLM is formed in a resistance change layer RCL sandwiched between an upper electrode UE and a lower electrode BE. In the present embodiment 1, a forming operation is used as the operation of transitioning the resistance change device RCD1 from its initial resistance state to a low resistance state. Specifically, as shown in the central diagram of FIG. 5, a gate voltage (e.g., Vw1=1.2V) greater than or equal to a threshold voltage of a cell transistor CT1 is applied to a gate electrode of the cell transistor CT1 to thereby apply Vp1=3V (first high potential) to a plate line and apply Vb1=0V (first low potential) to a bit line in a selected state of the memory cell. Thus, as shown in the right diagram of FIG. 5, a conductive path FLM comprised of a chain of oxygen deficiency is formed in the resistance change layer RCL sandwiched between the upper electrode UE and the lower electrode BE. Consequently, the low resistance state of the resistance change device RCD1 is realized.

Incidentally, as a reading operation of the special data storage memory in the present embodiment 1, for example, a gate voltage (e.g. Vw1=1.2V) greater than or equal to the threshold voltage of the cell transistor CT1 is applied to the gate electrode thereof to thereby apply Vp1=0.4V to the plate line and apply Vb1=0V to the bit line in the selected state of the memory cell. Then, the reading operation can be performed by detecting the magnitude of current flowing in this state.

Thus, in the present embodiment 1, the forming operation is used as the operation of writing the information into the special data storage memory. That is, in the special data storage memory in the present embodiment 1, as shown in FIG. 5, for example, "0" is adapted to the initial resistance state of the resistance change device RCD1, whereas "1" is adapted to the low resistance state of the resistance change device RCD1 Thus, the special data storage memory in the present embodiment 1 is capable of storing information comprised of "0" and "1".

Particularly, in the special data storage memory in the present embodiment 1, the transition from the initial resistance state to the low resistance state is used in the information writing process at the forming operation, and the transition from the high resistance state to the low resistance state does not exist therein. It is therefore possible to improve the information retention resistance. That is, in the present embodiment 1, first, the information retention resistance can be enhanced by a factor (first factor) that the transition from the high resistance state which deteriorates the information retention resistance to the low resistance state is not used. Further, in the present embodiment 1, the information retention resistance can be improved even by a factor (second factor) that the state of the resistance change device RCD1 adapted to "0" is of the initial resistance state. This is because the initial resistance state is very higher in resistance value than the high resistance state, and a level difference (difference in resistance value) between "0" and "1" becomes large in the case where "0" is adapted to the initial resistance state and "1" is adapted to the low resistance state, as compared with the case where "0" is adapted to the high resistance state and "1" is adapted to the low resistance state. That is, even if the resistance value in the low resistance state slightly rises due to the application of a thermal load, the retention that "1" is reversed to "0" becomes hard to occur because the difference in resistance value between "0" and "1" is large, in the special data storage memory in the present embodiment 1. As a result, the special data storage memory in the present embodiment 1 is capable of obtaining the very high information retention resistance by the synergistic effect of the first and second factors described above.

Further, the special data storage memory in the present embodiment 1 is also capable of obtaining an advantage shown below by the above-described second factor. That is, the increase in the difference in the resistance value between "0" and "1" means that multi-valuing of the special data storage memory becomes easy. Thus, the special data storage memory in the present embodiment 1 is capable of obtaining, as a secondary effect brought about from the above-described second factor, an effect that the occupation area of the special data storage memory is reduced by the multi-valuing where the same storage capacity is ensured. In other words, when the same occupation area is taken up as a premise, an increase in the storage capacity of the special data storage memory by the multi-valuing can be achieved.

Also, according to the present embodiment 1, advantages shown below can be obtained. That is, since the above-described special data storage memory is normally used as the singular-time write memory, the information writing condition can be determined without considering the number of times of writing. From this, the forming operation which is the information writing operation can be carried out on a strong condition (under which the amount of current is large). In this case, since a low resistance state further lower than normal can be realized, a reading speed can be increased.

Further, since the switching operation is not used in the special data storage memory in the present embodiment 1, a circuit for switching between the off operation and the on operation becomes unnecessary. As a result, according to the present embodiment 1, the occupation area of the resistance change memory can be reduced. In particular, the present embodiment 1 is capable of obtaining the synergistic effect of the effect of reducing the occupation area of the resistance change memory by the above-described multi-valuing and the effect of reducing the occupation area of the resistance change memory with the simplification of the above-described peripheral circuit. As a result, it is possible to realize a size reduction in the resistance change memory in the present embodiment 1. Further, the size reduction in the resistance change memory contributes to an increase in the number of semiconductor chips to be obtained from the semiconductor wafer. Therefore, according to the present embodiment 1, the effect of reducing the manufacturing cost of the resistance change memory can also be obtained.

Subsequently, the information writing operation of the general-purpose data storage memory will be described. The general-purpose data storage memory is different from the special data storage memory and used as a multiple-times write memory. Therefore, a description will be made below about the information writing operation predicated on the use of the general-purpose data storage memory as the multiple-times write memory.

Figure 6:
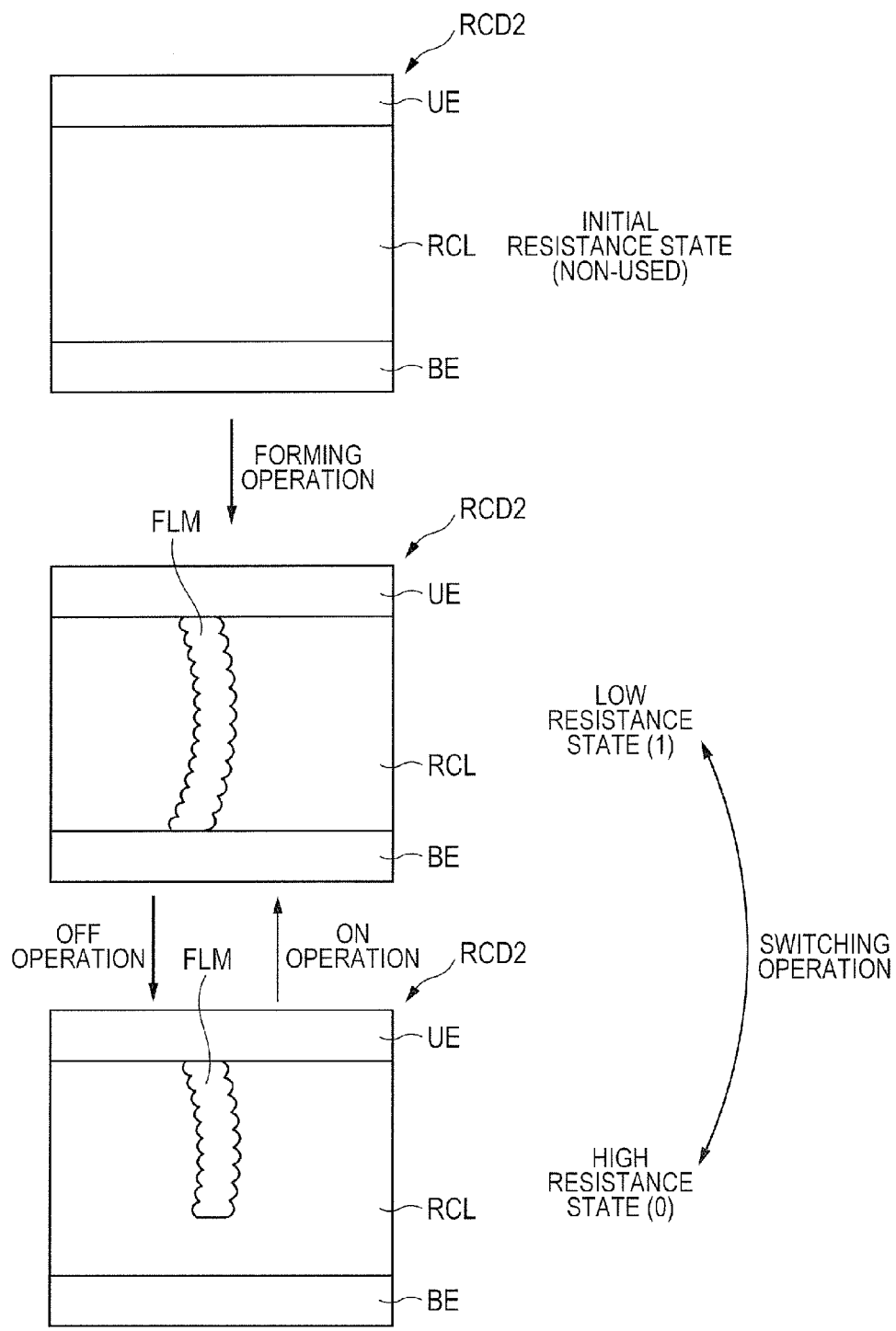
FIG. 6 is a typical diagram for describing the operation of writing information into a general-purpose data storage memory in the embodiment 1.

FIG. 6 is a typical diagram for describing the operation of writing information into the general-purpose data storage memory in the present embodiment 1. A typical configuration of a resistance change device RCD2 which configures a storage part of a memory cell in the general-purpose data storage memory in the present embodiment 1 is shown in FIG. 6. A state shown in the upper diagram of FIG. 6 indicates an initial resistance state of the resistance change device RCD2. In this initial resistance state, no conductive path FLM is formed in a resistance change layer RCL sandwiched between an upper electrode UE and a lower electrode BE. In the present embodiment 1, a forming operation is used as the operation of transitioning the resistance change device RCD2 from its initial resistance state to a low resistance state. Thus, as shown in the central diagram of FIG. 6, a conductive path FLM comprised of a chain of oxygen deficiency is formed in the resistance change layer RCL sandwiched between the upper electrode UE and the lower electrode BE. As a result, the low resistance state of the resistance change device RCD2 is realized.

In the general-purpose data storage memory in the present embodiment 1, after the execution of the above-described forming operation, a switching operation using a potential lower in absolute value than the forming operation is used as the information writing operation. This switching operation will be described below.

In FIG. 6, the resistance change device RCD2 is transitioned from the low resistance state thereof shown in the central diagram of FIG. 6 to its high resistance state shown in the lower diagram of FIG. 6. That is, the high resistance state is realized by causing part of the conductive path FLM present in the low resistance state to disappear. The operation of transitioning the resistance change device RCD2 from the low resistance state to the high resistance state is an off operation.

Subsequently, in FIG. 6, the resistance change device RCD2 is transitioned from the high resistance state of the resistance change device RCD2 shown in the lower diagram of FIG. 6 to the low resistance state of the resistance change device RCD2 shown in the central diagram of FIG. 6. That is, the low resistance state is realized by recovering part of the conductive path FLM, which is missing in the high resistance state. The operation of transitioning the resistance change device RCD2 from the high resistance state to the low resistance state is an on operation. Further, the writing of information into the general-purpose data storage memory can be realized by alternately carrying out the off operation and the on operation. That is, in the present embodiment 1, the forming operation for the general-purpose data storage memory is first executed before the execution of the operation of writing the information into the general-purpose data storage memory. Thereafter, the switching operation which is the operation of writing the information into the general-purpose data storage memory is carried out. At this time, the switching operation is comprised of the off operation for transitioning the resistance change device RCD2 from the low resistance state to the high resistance state, and the on operation for transitioning the resistance change device RCD2 from the high resistance state to the low resistance state.

Thus, in the present embodiment 1, the switching operation is used as the operation of writing the information into the general-purpose data storage memory. Further, in the general-purpose data storage memory in the present embodiment 1, as shown in FIG. 6, for example, the initial resistance state of the resistance change device RCD2 is not adapted to the information and is intended for "non-use". On the other hand, in the general-purpose data storage memory in the present embodiment 1, "0" is adapted to the high resistance state of the resistance change device RCD2, whereas "1" is adapted to the low resistance state of the resistance change device RCD2. Thus, the general-purpose data storage memory in the present embodiment 1 is capable of storing information comprised of "0" and "1".

Figure 7A:
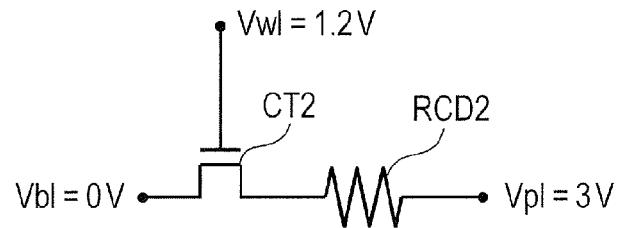
FIG. 7A is a diagram showing a concrete condition for a forming operation in the general-purpose data storage memory.
Figure 7B:
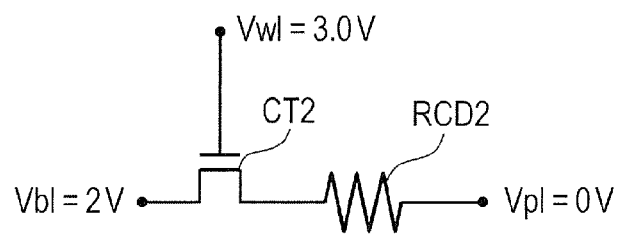
FIG. 7B is a diagram showing a concrete condition for an off operation in the general-purpose data storage memory.
Figure 7C:
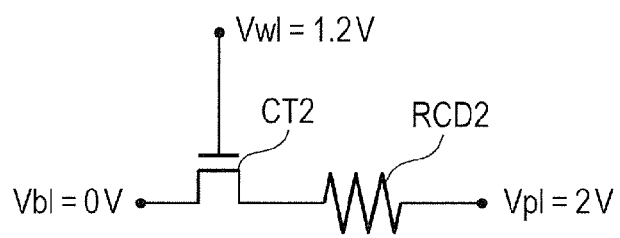
FIG. 7C is a diagram showing a concrete condition for an on operation in the general-purpose data storage memory.

Next, a description will be made about concrete operation conditions including the switching operation which is the operation of writing the information into the general-purpose data storage memory in the present embodiment 1. FIGS. 7A to 7C is a diagram showing concrete operation conditions of the general-purpose data storage memory. In particular, FIG. 7A is a diagram showing a concrete condition for a forming operation in the general-purpose data storage memory, FIG. 7B is a diagram showing a concrete condition for an off operation in the general-purpose data storage memory, and FIG. 7C is a diagram showing a concrete condition for an on operation in the general-purpose data storage memory.

In FIG. 7A, in the forming operation in the general-purpose data storage memory, a gate voltage (e.g., Vw1=1.2V) greater than or equal to a threshold voltage of a cell transistor CT2 is applied to a gate electrode of the cell transistor CT2 to thereby apply Vp1=3V (first high potential) to a plate line and apply Vb1=0V (first low potential) to a bit line in a selected state of a memory cell. Thus, as shown in FIG. 6, the conductive path FLM comprised of the chain of oxygen deficiency is formed in the resistance change layer RCL sandwiched between the upper electrode UE and the lower electrode BE. Consequently, the low resistance state of the resistance change device RCD2 is realized.

Subsequently, in FIG. 7B, in the off operation in the general-purpose data storage memory, a gate voltage (e.g., Vw1=3.0V) greater than or equal to the threshold voltage of the cell transistor CT2 is applied to the gate electrode of the cell transistor CT2 to thereby apply Vp1=0V (first low potential) to the plate line and apply Vb1=2V (second high potential) to the bit line in the selected state of memory cell. Thus, as shown in FIG. 6, part of the conductive path FLM formed in the resistance change layer RCL sandwiched between the upper electrode UE and the lower electrode BE disappears. As a result, the high resistance state of the resistance change device RCD2 is realized.

Next, in FIG. 7C, in the on operation in the general-purpose data storage memory, a gate voltage (e.g., Vw1=1.2V) greater than or equal to the threshold voltage of the cell transistor CT2 is applied to the gate electrode of the cell transistor CT2 to thereby apply Vp1=2V (second high potential) to the plate line and apply Vb1=0V (first low potential) to the bit line in the selected state of memory cell. Thus, as shown in FIG. 6, the conductive path FLM being formed in the resistance change layer RCL sandwiched between the upper electrode UE and the lower electrode BE is recovered. As a result, the low resistance state of the resistance change device RCD2 is realized.

Incidentally, as a reading operation of the general-purpose data storage memory in the present embodiment 1, for example, a gate voltage (e.g. Vw1=1.2V) greater than or equal to the threshold voltage of the cell transistor CT2 is applied to the gate electrode thereof to thereby apply Vp1=0.4V to the plate line and apply Vb1=0V to the bit line in the selected state of memory cell. Then, the reading operation can be performed by detecting the magnitude of current flowing in this state.

It is understood that after the forming operation is performed in the above-described manner in the general-purpose data storage memory in the present embodiment 1, the information can be written into the resistance change device RCD by repeating the switching operation comprised of the on operation and the off operation. That is, it is understood that the information can be rewritten into the resistance change device RCD at any number of times by repeating the switching operation. The general-purpose data storage memory is capable of obtaining an advantage that the information can be written plural times only by the switching operation comprised of the off operation and the on operation.

Use of Resistance Change Memory in the Embodiment 1

In the present embodiment 1, the resistance change memories having the same structure are divided into the special data storage memory and the general-purpose data storage memory on the assumption that they are used in different applications. For example, in the present embodiment 1, in the manufacturing process of the semiconductor device, the special data storage memory can be used as the resistance change memory in which the special data such as the boot program, chip ID, test selection information, etc. are written, whereas the general-purpose data storage memory can be used as the resistance change memory in which the general-purpose data used for the user's normal applications after the completion of the product is written.

This is because since the large thermal load due to the subsequent heating step is applied in the resistance change memory in which the data is written during the manufacturing process of the semiconductor device, it is necessary to suppress the disappearance of information due to the retention failure (reversal) even if the large thermal load is applied. Thus, the reliability of the semiconductor device can be improved by using the special data storage memory higher in information retention resistance than the general-purpose data storage memory with respect to the resistance change memory in which the data is written during the manufacturing process of the semiconductor device. On the other hand, since the large thermal load does not exist after data writing in the resistance change memory in which the general-purpose data used for the user's normal applications after the completion of the product is written, the general-purpose data storage memory can be used. Thus, in the present embodiment 1, the special data storage memory is used as for the resistance change memory which requires the high information retention resistance, and the general-purpose data storage memory operated by the switching operation is used as for the resistance change memory which is suffice by the normal information retention resistance. Consequently, the information retention resistance can be improved with respect to the resistance change memory which requires the high information retention resistance. Further, the resistance change memory suitable for the multiple-times writing can be used with respect to the resistance change memory predicated on the multiple-times writing. It is thus possible to improve reliability while optimizing the semiconductor device including the resistance change memory.

The technical idea in the present embodiment 1 is however not limited to this. For example, the special data storage memory is used as the resistance change memory in which information is written in a first step of the manufacturing process of the semiconductor device. The general-purpose data storage memory can also be used as the resistance change memory in which information is written in a second step after the first step, of the manufacturing process of the semiconductor device. This is because, for example, when the heating step exists between the first step and the second step, the resistance change memory in which the information is written in the first step is required to have information retention resistance higher than that for the resistance change memory in which the information is written in the second step. For example, in FIG. 3, the wafer test step may be mentioned as the first step, and the post-assembly test step may be mentioned as the second step. In this case, the assembly step including the heating step is performed between the first step and the second step. Accordingly, the second step becomes larger in thermal history than the first step.

Embodiment 2

Novel Finding Found by the Present Inventors

Figure 8:
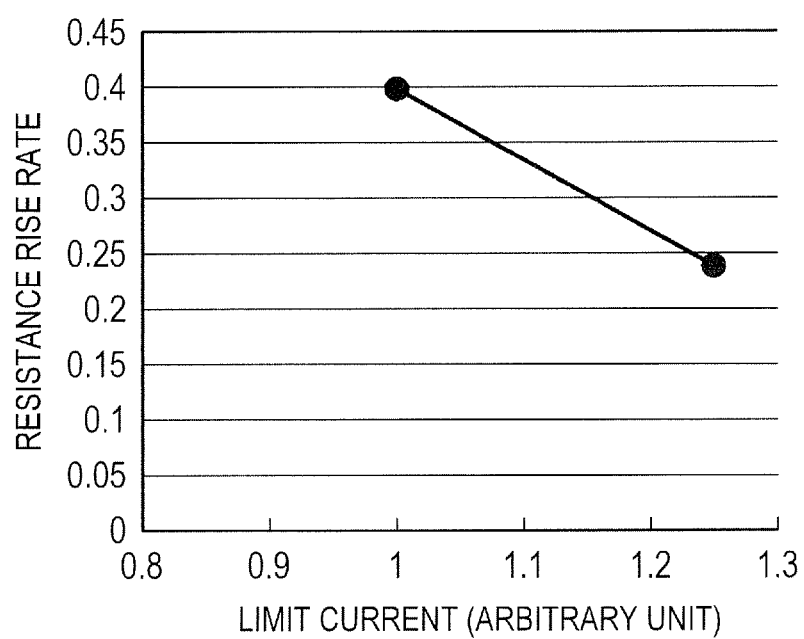
FIG. 8 is a graph showing the relationship between a resistance rise rate in a low resistance state under a state in which the resistance change device is maintained at the temperature of 250° C., and a write current (limit current) at an on operation.

FIG. 8 is a graph showing the relationship between a resistance rise rate in a low resistance state under a state in which a resistance change device is maintained at a temperature of 250° C., and a write current (limit current) at an on operation. In FIG. 8, the horizontal axis indicates the magnitude of the limit current, and the vertical axis indicates the resistance rise rate in the low resistance state. As shown in FIG. 8, a correlation is established between the magnitude of the limit current and the resistance rise rate. Specifically, it is understood that as the limit current at the on operation is increased, a resistance rise rate in a state in which the resistance change device is maintained at the temperature of 250° C. becomes small. From this point, the novel finding found by the present inventors means that when the limit current at the on operation is made large, the resistance rise rate in the low resistance state at the high temperature is smaller than when the limit current at the on operation is small, thus enhancing information retention resistance.

Therefore, the present inventors have envisioned a basic idea in the present embodiment 2 shown below, based on the novel finding. The basic idea will therefore be described below.

Basic Idea in the Embodiment 2

The basic idea in the present embodiment 2 is an idea that a resistance change memory large in current driving force is used for a resistance change memory required to have information retention resistance higher than that for a resistance change memory which requires normal information retention resistance. That is, the basic idea in the present embodiment 2 is based on assuming that a special data storage memory and a general-purpose data storage memory are provided. Then, a memory cell of the special data storage memory has a first semiconductor device for selecting the memory cell, and a first resistance change device coupled in series with the first semiconductor element. Further, a memory cell of the general-purpose data storage memory has a second semiconductor element for selecting the memory cell, and a second resistance change device coupled in series with the second semiconductor element. At this time, the first semiconductor element is comprised of a high current driving element capable of being driven up to a first allowable current. The second semiconductor element is comprised of a low current driving element capable of being driven up to a second allowable current lower than the first allowable current. Thus, the limit current at the on operation can be made large in the special data storage memory required to have high information retention resistance. As a result, the special data storage memory required to have the high information retention resistance is capable of suppressing the resistance rise rate in the low resistance state at the high temperature, thus making it possible to achieve an improvement in the information retention resistance.

Embodied Features of Basic Idea

As the embodied configuration of the above-described basic idea, for example, the first semiconductor element which configures the memory cell of the special data storage memory is comprised of a first cell transistor having a first gate electrode. The second semiconductor element which configures the memory cell of the general-purpose data storage memory is comprised of a second cell transistor having a second gate electrode. Further, a feature point in the present embodiment 2 resides in that a first gate width of the first gate electrode is made larger than a second gate electrode of the second gate electrode. Thus, it is possible to improve the current driving force of the special data storage memory. As a result, since the limit current at the on operation can be made large in the special data storage memory required to have the high information retention resistance, the resistance rise rate in the low resistance state at the high temperature can be suppressed, thus making it possible to achieve an improvement in the information retention resistance.

Figure 9:
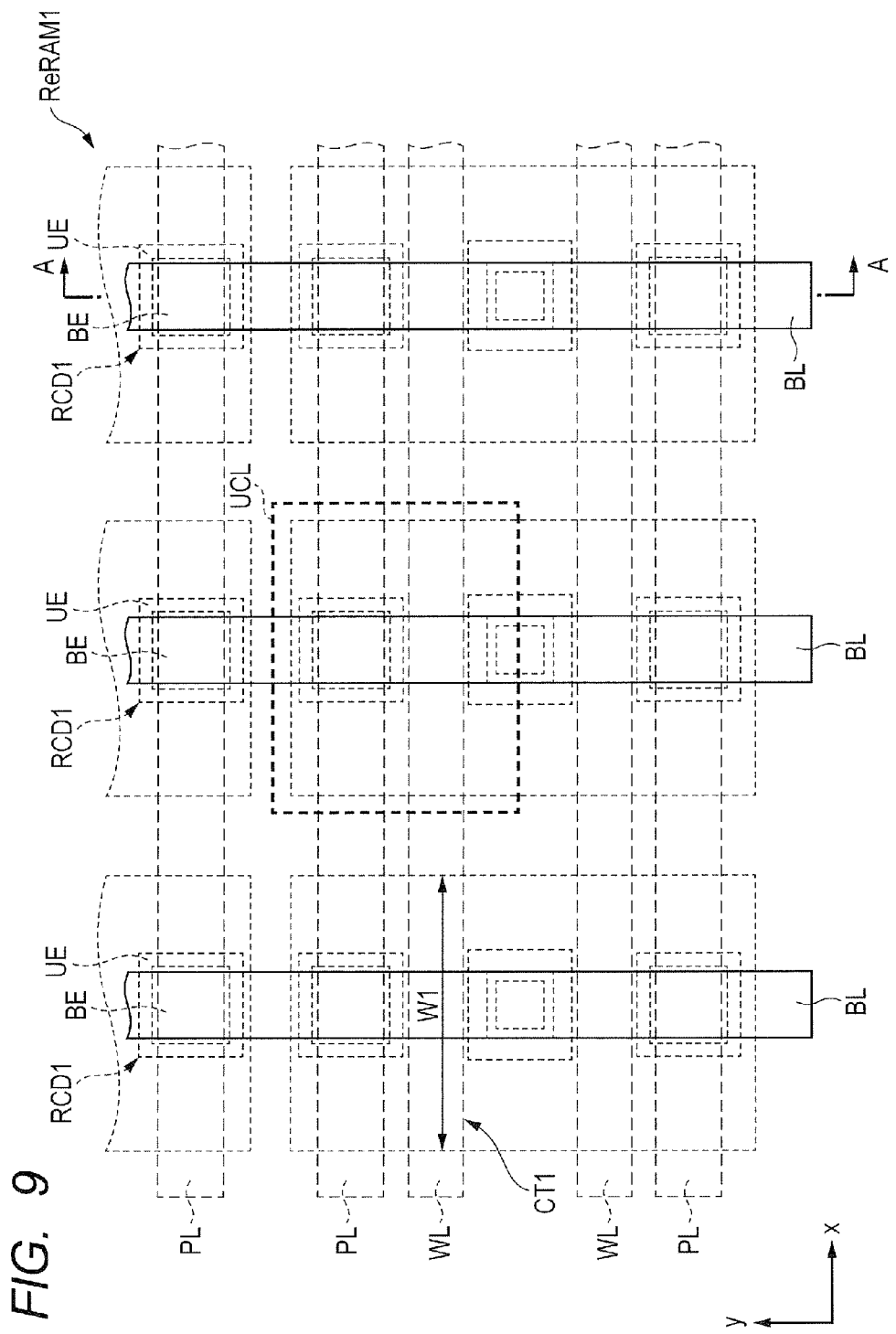
FIG. 9 is a diagram showing a planar layout configuration of a special data storage memory in an embodiment 2.

FIG. 9 is a diagram showing a planar layout configuration of a special data storage memory ReRAM1 in the present embodiment 2. In FIG. 9, the special data storage memory ReRAM1 in the present embodiment 2 is equipped with a plurality of unit cells UCL arranged in a matrix form, each of which has a plate line PL extending in an x direction, a word line WL extending in the x direction, and a bit line BL extending in a y direction. Then, each of the unit cells UCL has a resistance change device RCD1 and a cell transistor CT1. Each resistance change device RCD1 including an upper electrode UE, a lower electrode BE, and a resistance change layer (not shown) is formed in an intersecting region of the plate line PL with the bit line BL in plan view. Further, the word line WL functions as a gate electrode of the cell transistor CT1. A gate width W1 of the gate electrode thereof is shown in FIG. 9.

Figure 10:
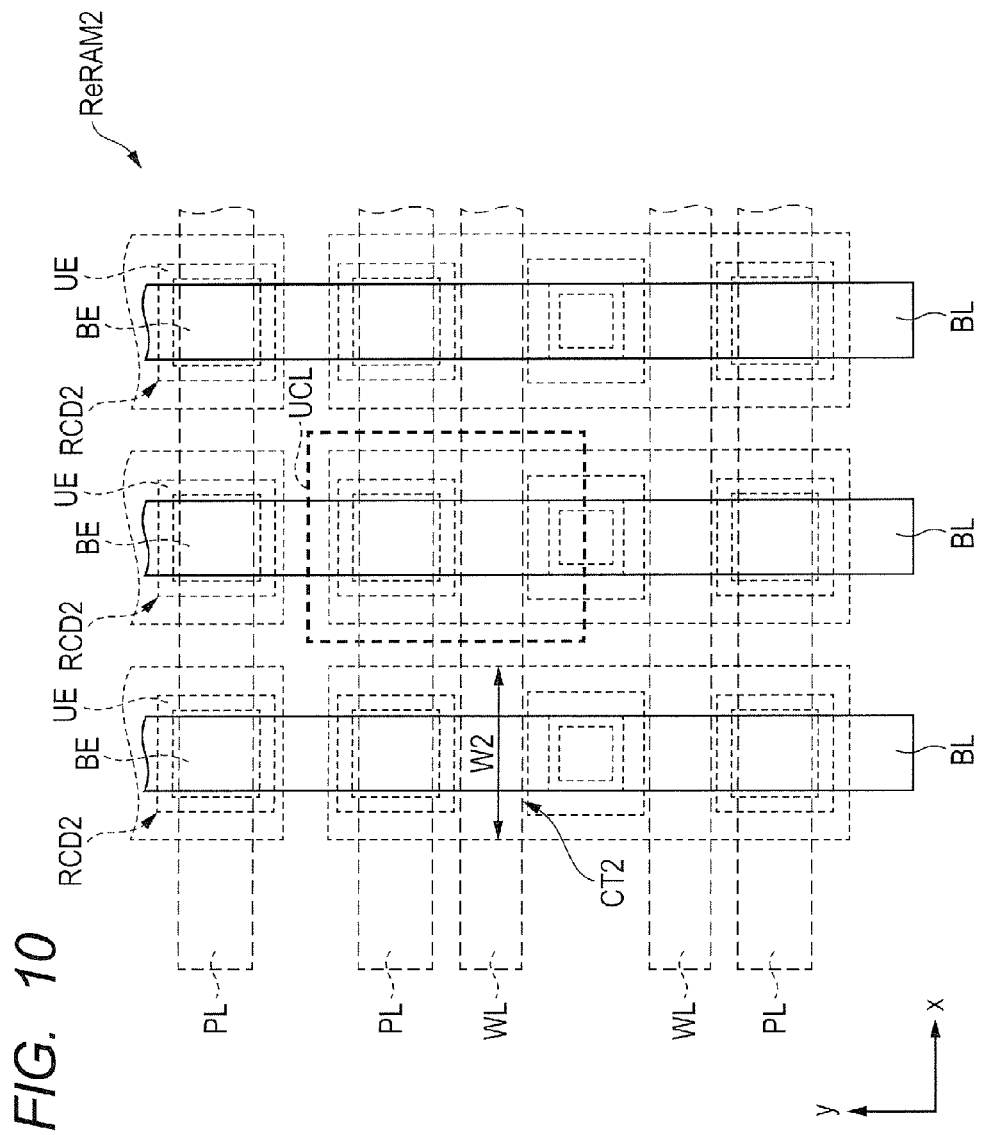
FIG. 10 is a diagram showing a planar layout configuration of a general-purpose data storage memory in the embodiment 2.

FIG. 10 is a diagram showing a planar layout configuration of a general-purpose data storage memory ReRAM2 in the present embodiment 2. In FIG. 10, the general-purpose data storage memory ReRAM2 in the present embodiment 2 is equipped with a plurality of unit cells UCL arranged in a matrix form, each of which has a plate line PL extending in an x direction, a word line WL extending in the x direction, and a bit line BL extending in a y direction. Then, each of the unit cells UCL has a resistance change device RCD2 and a cell transistor CT2. Each resistance change device RCD2 including an upper electrode UE, a lower electrode BE, and a resistance change layer (not shown) is formed in an intersecting region of the plate line PL with the bit line BL in plan view. Further, the word line WL functions as a gate electrode of the cell transistor CT2. A gate width W2 of the gate electrode thereof is shown in FIG. 10.

Here, as is understood from the contrast between FIG. 9 and FIG. 10, the gate width W1 of the cell transistor CT1 becomes larger than the gate width W2 of the cell transistor CT2. Thus, each memory cell of the special data storage memory ReRAM1 shown in FIG. 9 is capable of setting the limit current corresponding to the write current at the on operation larger than that in each memory cell of the general-purpose data storage memory ReRAM2 shown in FIG. 10. Thus, since the special data storage memory required to have the high information retention resistance is capable of increasing the limit current at the on operation, the resistance rise rate in the low resistance state at the high temperature can be suppressed, thus making it possible to achieve an improvement in the information retention resistance.

Use of Resistance Change Memory in the Embodiment 2

For example, in the present embodiment 2, in the manufacturing process of the semiconductor device, the special data storage memory ReRAM1 is used as a resistance change memory in which special data such as a boot program, a chip ID, test selection information, etc. are written, whereas the general-purpose data storage memory ReRAM2 can be used as a resistance change memory in which general-purpose data used for user's normal applications after the completion of a product are written. This is because since a large thermal load due to a subsequent heating step is applied in the resistance change memory in which data is written during the manufacturing process of the semiconductor device, it is necessary to suppress the disappearance of information due to a retention failure (reversal) even if the large thermal load is applied. Accordingly, the special data storage memory ReRAM1 having each memory cell large in gate width is used for the resistance change memory in which the data is written during the manufacturing process of the semiconductor device. Thus, the limit current which is the write current at the on operation, can be made large. As a result, since it is possible to achieve an improvement in the information retention resistance, the disappearance of the information can be suppressed even if the large thermal load is applied.

On the other hand, since the large thermal load does not exist after data writing in the resistance change memory in which the general-purpose data used for the user's normal applications is written after the completion of the product, the general-purpose data storage memory ReRAM2 having each memory cell small in gate width can be used. Thus, the occupation area of the general-purpose data storage memory ReRAM2 can be reduced. Incidentally, since the special data storage memory ReRAM1 has the memory cells large in gate width, the area of each cell increases. Since, however, the capacity of the above-described special data storage memory has a small capacity like a few tens of bytes to a several hundreds of bytes, the influence given to the whole area of a semiconductor chip is small.

Here, data is written in the special data storage memory during the manufacturing process of the semiconductor device, whereas data is written into the general-purpose data storage memory by a user after the completion of the semiconductor device. It can thus be said that when the stage of the completion of the semiconductor device (shipment stage) is taken into consideration, the special data storage memory is placed in an information written state, and the general-purpose data storage memory is placed in an information non-written state.

Device Structure

A description will next be made about a device structure of the resistance change memory (common to the special data storage memory ReRAM1 and the general-purpose data storage memory ReRAM2) in the present embodiment 2.

Figure 11:
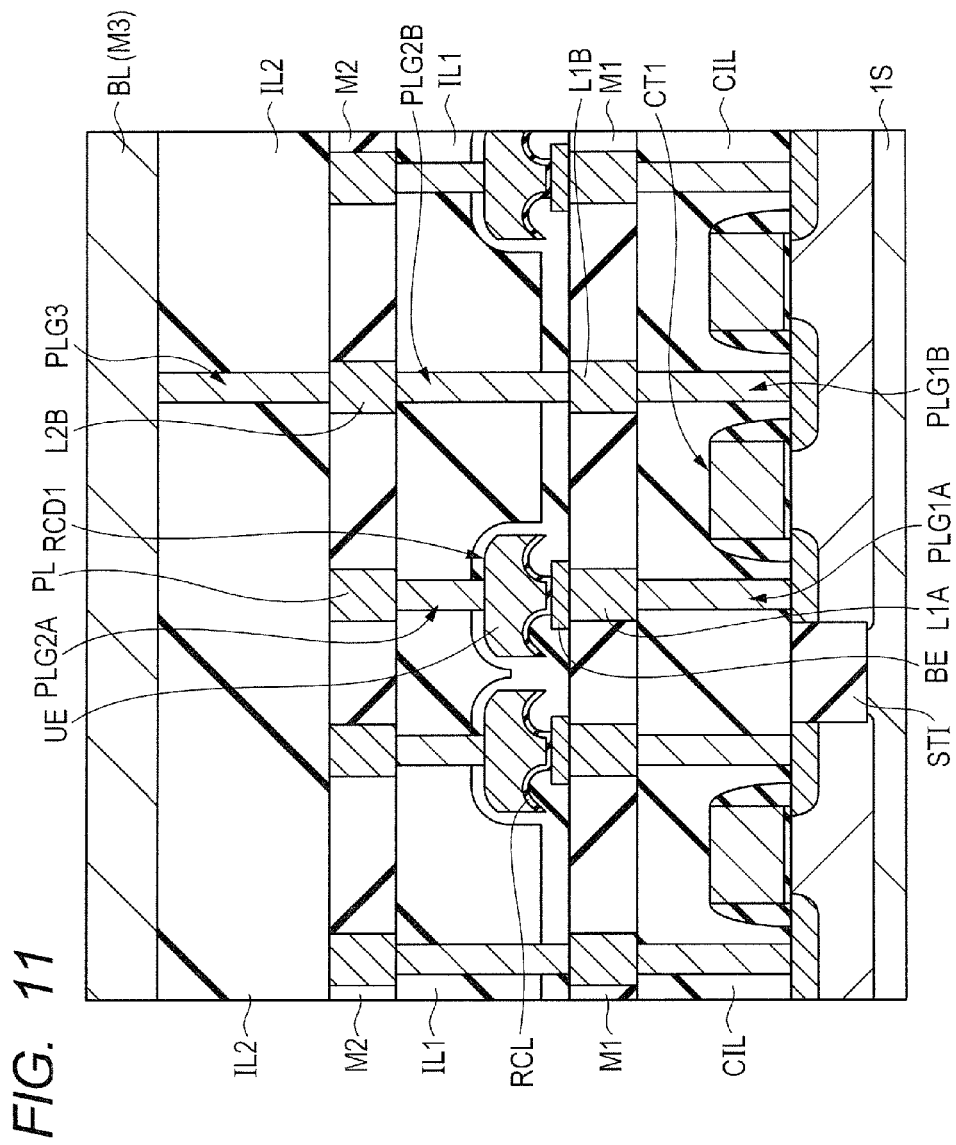
FIG. 11 is a sectional diagram cut along line A-A of FIG. 9.

FIG. 11 is a sectional diagram cut along line A-A of FIG. 9. In FIG. 11, the resistance change memory in the present embodiment 2 has a cell transistor CT1 provided over a semiconductor substrate 1S. A contact interlayer insulating film CIL comprised of, for example, a silicon oxide film is formed so as to cover the cell transistor CT1. Then, a first wiring layer M1 is formed over the contact layer insulating film CIL. A wiring L1A which configures the first wiring layer, and the cell transistor CT1 are electrically coupled to each other by a plug PLG1A which penetrates the contact interlayer insulating film CIL. Further, a wiring L1B which configures the first wiring layer, and the cell transistor CT1 are electrically coupled to each other by a plug PLG1B which penetrates the contact interlayer insulating film CIL.

Subsequently, a resistance change device RCD1 is formed over the first wiring layer. An interlayer insulating film IL1 is formed so as to cover the resistance change device RCD1. The resistance change device RCD1 is comprised of a lower electrode BE, a resistance change layer RCL formed over the lower electrode BE, and an upper electrode UE formed over the resistance change layer RCL. At this time, the lower electrode BE is formed of, for example, a ruthenium film (Ru film), and the resistance change layer RCL is comprised of, for example, a tantalum oxide film ($Ta_2O_5$ film) which is a metal oxide film. Further, the upper electrode UE is formed of, for example, a tungsten film (W film). Then, the lower electrode BE is formed over the wiring L1A, and the resistance change device RCD1 and the cell transistor CT1 are electrically coupled to each other through the wiring L1A and the plug PLG1A.

Next, a second wiring layer M2 is formed over the interlayer insulating film IL1. The plate line PL which configures the second wiring layer M2, and the upper electrode UE of the resistance change device RCD1 are electrically coupled to each other through a plug PLG2A formed in the interlayer insulating film IL1. Further, a plug PLG2B is formed in the interlayer insulating film IL1. The wiring L1B which configures the first wiring layer M1, and a wiring L2B which configures the second wiring layer M2, are electrically coupled to each other through the plug PLG2B.

Then, an interlayer insulating film IL2 is formed over the second wiring layer M2. A bit line BL which configures a third wiring layer M3 is formed over the interlayer insulating film IL2. The bit line BL is electrically coupled to the wiring L2B configuring the second wiring layer M2 via a plug PLG3 formed in the interlayer insulating film IL2. Thus, the bit line BL and the cell transistor CT1 are electrically coupled to each other. The device structure of the resistance change memory in the present embodiment 2 is formed in the above-described manner.

Feature on Device Structure

Subsequently, a description will be made about a feature point on the device structure in the present embodiment 2. In FIG. 11, the feature point on the device structure in the present embodiment 2 resides in that the resistance change device RCD1 is arranged between the first wiring layer M1 and the second wiring layer M2 in a sectional view.

It is considered that the resistance change device RCD1 is arranged between the semiconductor substrate 1S and the first wiring layer M1 in the sectional view, for example. There is however a case where the semiconductor chip is formed with MOSFETs (Metal Oxide Semiconductor Field Effect Transistors) configuring a logic circuit in addition to the resistance change memory shown in FIG. 11. When the resistance change device RCD1 is arranged between the semiconductor substrate 1S and the first wiring layer M1 where the logic circuit and the resistance change memory are mixed, the thickness of the contact interlayer insulating film CIL shown in FIG. 11 changes. The change in the thickness of the contact interlayer insulating film CIL means that the thickness of the contact interlayer insulating film CIL formed with the MOSFETs that configures the logic circuit also changes. In this case, the electrical characteristics of the logic circuit will change. That is, when the resistance change device RCD1 is arranged between the semiconductor substrate 1S and the first wiring layer M1, the thickness of the contact interlayer insulating layer CIL changes and resultingly, the electrical characteristics of the logic circuit will change. Therefore, it cannot be said that it is desirable to arrange the resistance change device RCD1 therebetween.

On the other hand, there is considered a case where the resistance change device RCD1 is arranged in a multilayer wiring layer located further in the upper layer, or the uppermost layer (not shown) of wiring layers, or the like. Since, however, a wiring size becomes large in this case, the size of the resistance change device RCD1 also becomes large. From this point of view, since the size of the resistance change device RCD1 increases when the resistance change device RCD1 is arranged in the multilayer wiring layer located in the upper layer, or the uppermost layer of the wiring layers, it cannot be said that it is desirable to arrange the resistance change device RCD1 therein in terms of achieving a size reduction in the resistance change memory.

Therefore, in the present embodiment 2, for example, the resistance change device RCD1 is arranged between the first wiring layer M1 and the second wiring layer M2 in the sectional view as shown in FIG. 11. Thus, first, a first advantage resides in that since it is not necessary to change the thickness of the contact interlayer insulating film CIL, a change in the electrical characteristics of the logic circuit can be suppressed. Subsequently to that, a second advantage resides in that since the first wiring layer M1 is minimized in wiring size, the size of the resistance change device RCD1 arranged between the first wiring layer M1 and the second wiring layer M2 can also be reduced. Therefore, according to the present embodiment 2, a size reduction in the resistance change memory can be achieved.

From the above, according to the present embodiment 2, there can be obtained a significant effect that the feature point that the resistance change device RCD1 is arranged between the first wiring layer M1 and the second wiring layer M2 in the sectional view does not affect the electrical characteristics of other circuits provided mixedly with the resistance change memory and makes it possible to achieve a size reduction in the resistance change memory.

Embodiment 3

Novel Finding Found by the Present Inventors

The present inventors have newly found that information retention resistance in a low resistance state of a resistance change memory is degraded as the number of times of repetition of a switching operation increases. It is considered that this is because as the number of times of the switching operation increases, the amount of oxygen accumulated in the neighborhood of an electrode at an off operation increases, and the increased oxygen acts in a direction (in the upward trend in resistance) to reduce oxygen deficiency in reaction with oxygen deficiency in a conductive path (filament). Thus, since the information retention resistance in the low resistance state at the on operation is relatively degraded in the resistance change memory in which the number of times of the switching operation is large, it is necessary to enlarge a write current (limit current) at an on operation and improve the information retention resistance in the low resistance state. In other words, since the information retention resistance in the low resistance state at the on operation becomes relatively high in the resistance change memory small in the number of times of the switching operation, it is possible to ensure the information retention resistance in the low resistance state even if the write current (limit current) at the on operation is made small.

Feature in the Embodiment 3

Thus, a feature point in the present embodiment 3 resides in that a resistance change memory large in current driving force is used for the resistance change memory in which the number of times of the switching operation is large, and a resistance change memory small in current driving force is used for the resistance change memory in which the number of times of the switching operation is small. Specifically, a memory cell including a cell transistor large in gate width is used for each memory cell of the resistance change memory in which the number of times of the switching operation is large. A memory cell including a cell transistor small in gate width is used for the memory cell of the resistance change memory small in the number of times of the switching operation. Thus, a cell area can be reduced as compared with the case where a cell transistor having a gate width similar to that of the cell transistor configuring the memory cell of the resistance change memory large in the number of times of the switching operation is adopted for the memory cell of the resistance change memory small in the number of times of the switching operation. To describe in an extreme manner, a memory cell including a cell transistor large in gate width is used for a memory cell of a multiple-times write memory, and a memory cell including a cell transistor small in gate width is used for a memory cell of a singular-time write memory.

Figure 12:
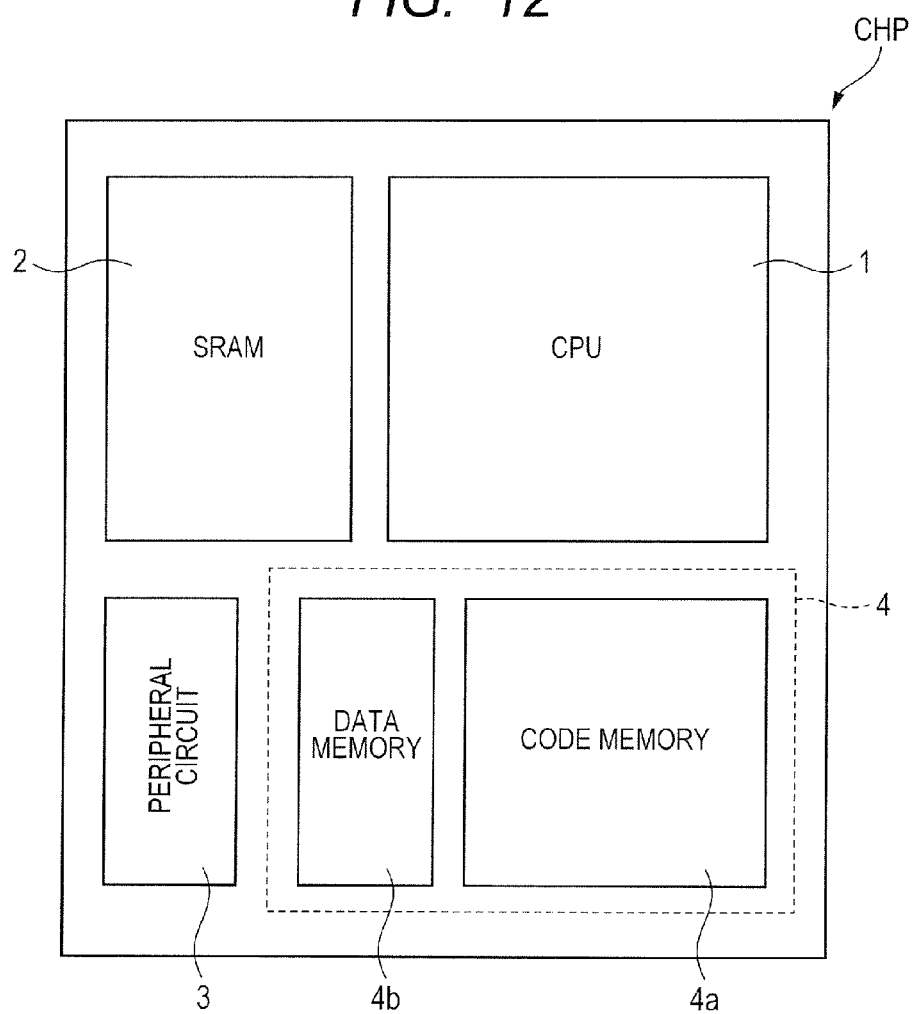
FIG. 12 is a diagram showing a layout configuration example of a semiconductor chip in an embodiment 3.

For example, FIG. 12 is a diagram showing a layout configuration example of a semiconductor chip CHP in the present embodiment 3. As shown in FIG. 12, the semiconductor chip CHP in the present embodiment 3 is intended to use an MCU chip formed with a microcomputer. A CPU1, an SRAM2, a peripheral circuit 3, and a resistance change memory 4 are mounted in the semiconductor chip CHP. Then, the resistance change memory 4 is provided with a code memory (program storage memory) 4a which stores a program code for executing a logical operation by the CPU1, and a data memory (data storage memory) 4b which stores data processed by execution of a program.

Here, the code memory 4a is small in the number of writing times of information and is about several hundreds of kilobytes at maximum in memory capacity. On the other hand, the data memory 4b is large in the number of writing times of the information, but is about several tens of kilobytes in memory capacity. Thus, for example, in a cell transistor of a memory cell which configures the code memory 4a small in the number of writings times of the information, information retention resistance can be ensured even if its gate width is made narrow. From this point, the gate width of the cell transistor of the memory cell which configures the code memory 4a small in the number of writing times of the information can be made narrower than that of a cell transistor of a memory cell which configures the data memory 4b large in the number of writing times of the information. Thus, according to the present embodiment 3, a cell area can be reduced with respect to the memory cell of the code memory 4a large in memory capacity. As a result, the whole area of the semiconductor chip CHP in the present embodiment 3 can be reduced.

Although the invention made above by the present inventors has been described specifically on the basis of the preferred embodiments, the present invention is not limited to the embodiments referred to above. It is needless to say that various changes can be made thereto within the scope not departing from the gist thereof.

The above embodiments include the following modes.

APPENDIX 1

A semiconductor device comprising:
a nonvolatile memory which is a resistance change memory and has a first memory cell including:
  a first semiconductor element which selects the first memory cell, and
  a first resistance change device coupled in series with the first semiconductor element,
in which the semiconductor device includes:
  a first wiring layer arranged above the first semiconductor element, and
  a second wiring layer arranged above the first wiring layer, and
in which the first resistance change device is arranged between the first wiring layer and the second wiring layer in a sectional view.

APPENDIX 2

A semiconductor device in which in the semiconductor device described in the appendix 1, the first resistance change device includes:
  a first lower electrode,
  a first resistance change layer formed over the first lower electrode, and
  a first upper electrode formed over the first resistance change layer, and
  the first resistance change layer is formed of a metal oxide film.

APPENDIX 3

A semiconductor device in which in the semiconductor device described in the Appendix 2, the first lower electrode is formed of a ruthenium film,
the first upper electrode is formed of a tungsten film, and
the first resistance change layer is formed of a tantalum oxide film.

APPENDIX 4

A semiconductor device comprising:
a nonvolatile memory which is a resistance change memory and has a first memory cell including:
  a first semiconductor element which selects the first memory cell, and
  a first resistance change device coupled in series with the first semiconductor element,
in which the first resistance change device stores information therein, based on an initial resistance state free of the presence of a conductive path, and a low resistance state, which are distinguished from each other, and
in which a resistance value in the initial resistance state is higher than a resistance value in the low resistance state.

APPENDIX 5

A semiconductor device comprising:
a nonvolatile memory which is a resistance change memory and has a first memory cell including:
  a first semiconductor element which selects the first memory cell, and
  a first resistance change device coupled in series with the first semiconductor element,
in which the first resistance change device stores information therein, based on an initial resistance state, a high resistance state, and a low resistance state distinguished from each other,
in which a resistance value in the initial resistance state is higher than a resistance value in the high resistance state, and
in which the resistance value in the high resistance state is higher than a resistance value in the low resistance state.

What is claimed is:
1. A semiconductor device, comprising:
a first nonvolatile memory which comprises a resistance change memory; and
a second nonvolatile memory which comprises a resistance change memory,
wherein a first memory cell of the first nonvolatile memory includes:
  a first semiconductor element which selects the first memory cell, and
  a first resistance change device coupled in series with the first semiconductor element,
wherein a second memory cell of the second nonvolatile memory includes:
  a second semiconductor element which selects the second memory cell, and
  a second resistance change device coupled in series with the second semiconductor element,
wherein the first resistance change device stores information therein, based on an initial resistance state and a low resistance state which are distinguished from each other,
wherein the second resistance change device stores information therein, based on a high resistance state and a low resistance state which are distinguished from each other, wherein a resistance value in the initial resistance state is higher than a resistance value in the high resistance state, and wherein a resistance value in the high resistance state is higher than a resistance value in the low resistance state.

2. The semiconductor device according to claim 1, wherein the first nonvolatile memory comprises a singular-time write memory, and wherein the second nonvolatile memory is a multiple-times write memory.

3. The semiconductor device according to claim 1, further comprising:

a word line electrically coupled to the first semiconductor element.

4. The semiconductor device according to claim 3, further comprising:

a bit line electrically coupled to the first semiconductor element.

5. The semiconductor device according to claim 4, further comprising:

a plate line electrically coupled to the first resistance change device.

6. The semiconductor device according to claim 5, wherein the first nonvolatile memory is configured such that a gate voltage greater than or equal to a threshold voltage of the first semiconductor element is applied to a gate electrode of the first semiconductor element to apply a high potential to the plate line and to apply a low potential, lower than the high potential, to the bit line for transitioning the first resistance change device from the initial resistance state to the low resistance state.

7. The semiconductor device according to claim 1, wherein, in the high resistance state, a part of a conductive path in a low resistance state is disappeared.

* * * * *